DELAY MULTIVIBRATOR

Filed April 20, 1965

INVENTOR
JOHN A. McAVOY

BY Kevin C. McMahon

AGENT

United States Patent Office 3,349,255
Patented Oct. 24, 1967

3,349,255
DELAY MULTIVIBRATOR

John A. McAvoy, Detroit, Mich., assignor to Burroughs Corporation, Detroit, Mich., a corporation of Michigan
Filed Apr. 20, 1965, Ser. No. 449,505
2 Claims. (Cl. 307—88.5)

ABSTRACT OF THE DISCLOSURE

A unijunction transistor circuit is coupled to a bistable multivibrator for resetting the multivibrator to its first state a predetermined time after it switched from its first to its second state. The delay time is determined by the time constant of an RC timing circuit which is independent of the multivibrator and coupled to the emitter of the unijunction transistor. Diode means couples the multivibrator to the timing circuit for clamping the timing circuit capacitor voltage below the firing voltage of the unijunction transistor while the multivibrator is on its first state.

My invention relates generally to delay circuits and, more particularly, to bistable multivibrators having attached to one side thereof an independent delay circuit for returning the multivibrator to a rest state a predetermined time after it is switched to the opposite state.

Time delay circuitry has become of increasing importance since the advent of electronic computers and supervisory control systems. It is of critical importance in these applications that the delay time be stable, that is, that it not be affected by variations in temperature, power supply voltage, and wave shapes of triggering pulses. Since delay circuits in computers are often used repeatedly with only very short amounts of time between successive uses, their recovery times must be very short, even for relatively long delay times. These circuits, when used in conjunction with diode coupled logic networks, also require a direct sink to ground on the output side during portions of their operating cycle.

Monostable multivibrators may be used as delay circuits but they have some serious disadvantages which limit their usefulness. In such conventional multivibrator circuits coupling capacitors usually also serve as timing capacitors. If long delays are required, electrolytic-type capacitors having large capacitances must be used with the result that the accuracy and stability of the delay time are severely limited. In such circuits the coupling capacitors also inherently produce considerable distortion of the output wave.

Unijunction transistor timing circuits have been used in conjunction with bistable multivibrators to form delay circuits. However, the timing portion of these circuits heretofore was, at least in part, integral with the multivibrator, so that the delay characteristics of the circuit were dependent on the parameters of the multivibrator and the delay time was adjustable over only a fairly narrow range.

It is, therefore, an object of my invention to provide a time delay circuit whose delay time is stable with variations in temperature and power supply voltages.

A further object of my invention is to provide a time delay circuit whose delay time and output wave shape are independent of the triggering wave shape.

A further object of my invention is to provide a time delay circuit having a stable delay time which will have an extremely fast recovery time.

A still further object of my invention is to provide a time delay circuit having a fast recovery time for use with a bistable multivibrator wherein the delay time is easily adjustable over a wide range.

In carrying out these and other objects of my invention, I have provided a delay circuit for adjustably resetting a bistable circuit to its rest state after it is switched to the opposite state, including a unijunction transistor, and means coupling the output of the unijunction transistor to the bistable circuit for resetting the bistable circuit upon the firing of the unijunction transistor. An adjustable RC timing circuit, independent of the bistable circuit is activated by the switching of the bistable circuit from its rest state to the opposite state for firing the unijunction transistor a predetermined time thereafter. The capacitor of the RC timing circuit discharges both through the unijunction transistor and the bistable circuit, giving a very rapid recovery time for the delay circuit.

Various other objects, advantages and features of my invention will become more fully apparent in the following specification with its appended claims, and accompanying drawings in which:

My invention can best be understood by referring to the following detailed description of the illustration embodiment.

Figures 1, 2:
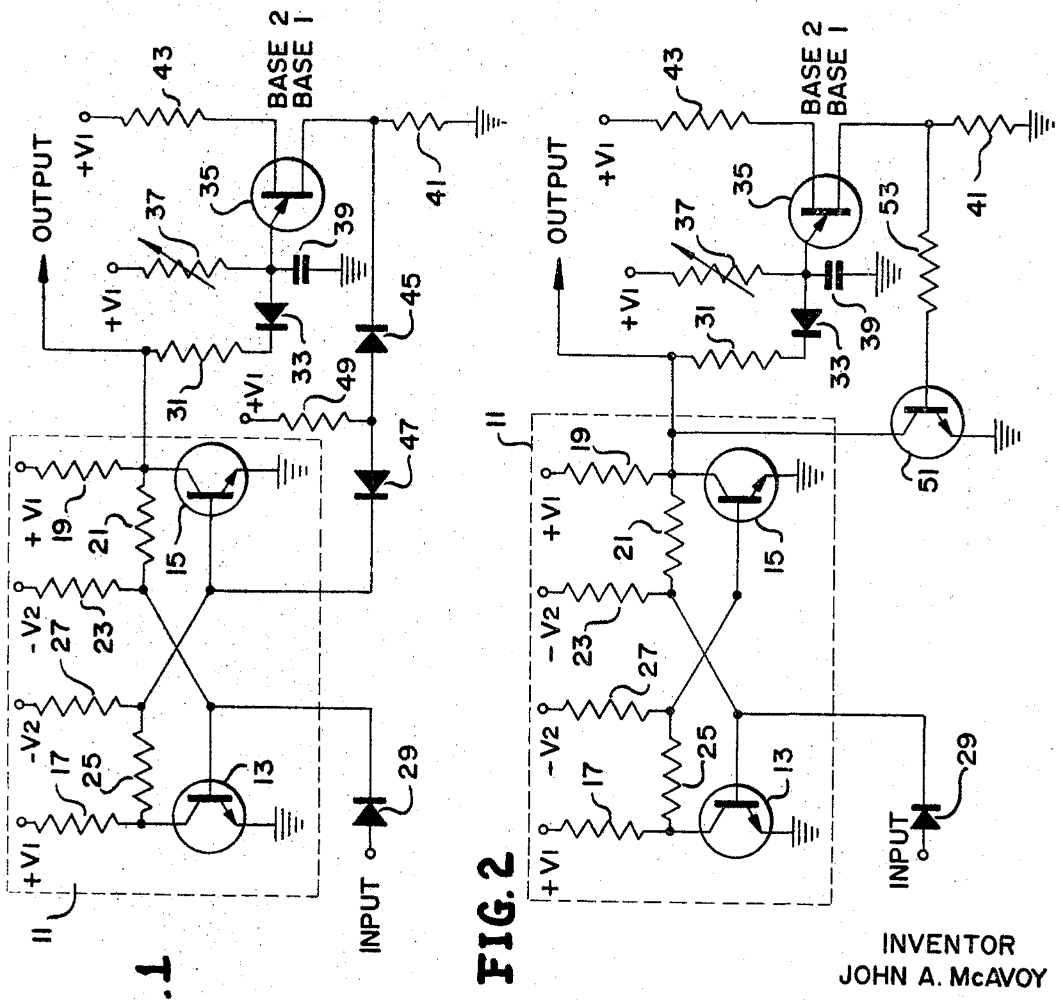
FIG. 1 is a schematic diagram of a circuit illustrating the preferred embodiment of my invention.
FIG. 2 is a schematic diagram of an alternate embodiment of my invention.

Referring now to FIG. 1 of the drawings, multivibrator 11 includes transistors 13 and 15 whose collectors are connected to voltage source +V1 through resistors 17 and 19, respectively. The emitters of both transistors are grounded. The base of transistor 13 is connected to the collector of transistor 15 through resistor 21 and to voltage source −V2 through resistor 23. The base of transistor 15 is connected to the collector of transistor 13 through resistor 25 and to voltage supply −V2 through resistor 27. The input pulse is delivered to the base of transistor 13 through diode 29.

The collector of transistor 15 is coupled through resistor 31 and diode 33 to the emitter of unijunction transistor 35. The emitter of the unijunction is also connected to the junction of variable resistor 37 and capacitor 39 of the series RC timing circuit. The other end of variable resistor 37 is connected to voltage supply +V1 and the free end of capacitor 39 is grounded. Base 1 and base 2 of unijunction 35 are connected to resistors 41 and 43, respectively. The free end of resistor 43 is connected to voltage source +V1 and the free end of resistor 41 is grounded. Base 1 of unijunction 35 is also connected to the cathode of diode 45. The anode of diode 45 is connected to the anode of diode 47 and also to resistor 49. The cathode of diode 47 is connected to the base of transistor 15 and the free end of resistor 49 is connected to voltage source +V1.

In the rest state of multivibrator 11, as illustrated, transistor 13 is "OFF" and transistor 15 is "ON." The voltage at the collector of transistor 15 is therefore close to ground and the capacitor 39 of the RC circuit is clamped through diode 33 to a potential well below the triggering voltage of the unijunction transistor 35.

The biasing circuit made up of voltage source +V1, resistor 49, and diode 47 is connected so that it tends to bias the transistor 15 to the "ON" state. It is prevented from operating while unijunction transistor 35 is off by diode 45 which clamps the junction of diode 47 and resistor 49 substantially at ground potential.

Figures 3A, 3B, 3C, 3D, 3E:
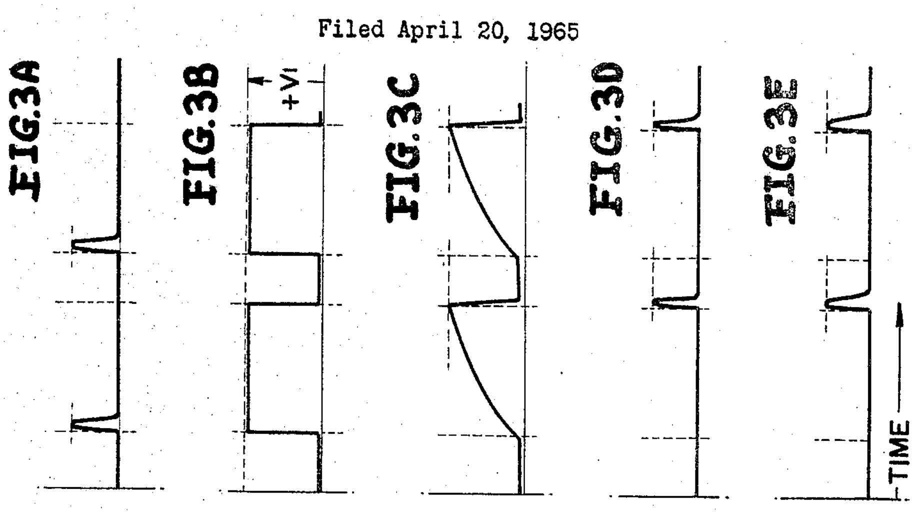
FIG. 3 is a timing diagram of waveforms at various points of my circuit as shown in FIG. 1.

When the base of transistor 13 is pulsed through diode 29, as in FIG. 3A, it starts to turn on and the multivibrator switches to the opposite state in normal regenerative fashion, turning transistor 15 off. FIG. 3B shows the resultant rise in the voltage at the collector of transistor 15 to approximately the supply voltage +V1. Diode 33 thereby becomes back biased and unclamps capacitor 39 from ground, allowing it to charge from voltage supply +V1 through variable resistor 37. As capacitor 39 charges exponentially according to the waveform of FIG. 3C, the voltage at the emitter of unijunction 35 increases until it reaches the triggering potential of the unijunction. When the voltage reaches this point the unijunction fires and a current pulse is emitted from its base 1, as in FIG. 3D, causing a positive voltage pulse to appear at the junction of resistor 41 and diode 45. This backbiases diode 45 and unclamps the junction of resistor 49 and diode 45 from ground and allows a current pulse, as in FIG. 3E, to flow from the positive source +V1 through resistor 49 and diode 47 into the base of transistor 15. The current pulse starts to turn transistor 15 on and the multivibrator switches regeneratively back to its rest state with transistor 15 "ON" and transistor 13 "OFF."

An alternate embodiment of my invention is illustrated in FIG. 2 of the drawings. The multivibrator 11 and the timing circuit are the same as in FIG. 1 so that corresponding components are identically numbered. The circuit of FIG. 2 is especially useful when short delays on the order of hundreds of microseconds are required. In such applications it is convenient to make capacitor 39 smaller than the value ordinarily used in the circuit of FIG. 1. Because of this, when the unijunction transistor 35 fires, the output derived from the discharge of the capacitor 39 through the unijunction transistor 35 might not be enough to enable the coupling circuit made up of diodes 45 and 47 and resistor 49 to reset multivibrator 11. In order to relieve this possible difficulty, the coupling circuit is replaced in FIG. 2 with transistor 51 and resistor 53. The base of transistor 51 is connected to the base 2 of the unijunction transistor 35 through resistor 53. The collector of transistor 51 is connected to the collector of transistor 15 and its emitter is grounded.

Multivibrator 11 and the timing circuit operate in the same manner as was described for the circuit of FIG. 1. When unijunction transistor 35 fires, a positive voltage pulse appears at the junction of resistor 41 and the base of transistor 51 thereby momentarily turning resistor 51 on. This causes the voltage at the collector of transistor 15 to drop to near ground potential and makes transistor 13 start to turn off. Multivibrator 11 then switches back to its rest state in normal regenerative fashion.

The collector of transistor 51 is connected to the collector rather than the base of transistor 15 because transistor 51 inverts the output pulse of the unijunction transistor 35 and therefore must be applied to the base of transistor 13 through resistor 21 to reset multivibrator 11.

The recovery time of the delay circuit is determined by the amount of time it takes for capacitor 39 to discharge, since, if capacitor 39 is not fully discharged before the multivibrator is retriggered, it will take less time for it to recharge to the triggering voltage and the delay time will be shorter than desired. The rapid discharge of capacitor 39 is insured by providing two discharge paths for it, the first through the emitter and base 1 of unijunction 35 and the second through diode 33, resistor 31, and transistor 15 to ground. Reset times of less than 3 microseconds were experienced with delays of 1 second.

The delay time is substantially independent of variations in power supply voltage because both variable resistor 37 and resistor 43 are connected to the same voltage source +V1. The triggering voltage for the unijunction transistor 35, which is constant over wide ranges of temperatures, is directly proportional to the supply voltage at resistor 43. Any change in the voltage source +V1 will change both the triggering voltage of the unijunction 35 and the shape of the charging voltage of the timing circuit FIG. 3C in the same direction.

Multivibrator 11 is standard and any bistable circuit may be used which has a terminal whose voltage is below triggering voltage of the unijunction in one state and above the triggering voltage of the unijunction in the other state. Preferably, but not essentially, this terminal should be close to ground potential and provide a low resistance path to ground in its lower potential state. The illustrated multivibrator uses transistors but other elements, both of the solid state and space discharge type, may equally well be used.

The input triggering pulse's only function is to cause multivibrator 11 to switch to the opposite state. The operation of the timing circuit in initiated by the change in voltage level at the collector of transistor 15 when it turns off. Thus the delay time is independent of the wave shape of the input pulse.

The delay time can be varied over a wide range by varying the time constant of the series RC timing circuit, according to the formula $T=RC$, where "T" equals the time constant, "R" is the value of resistance and "C" is the value of capacitance. This is usually accomplished by making resistor 37 variable and using a fixed capacitor.

If the circuit is used in conjunction with diode coupled logic network, a direct sink to ground is required during the time when multivibrator is in its rest state. Such a sink is provided from the collector to the emitter of transistor 15 to ground during the time that transistor 15 is "ON." The only voltage dropping element in the sink is transistor 15 which in its "ON" state causes a drop of less than .3 volt.

An example of values of components which were found to be suitable for my circuit is listed in the table below.

| Component | Value | |
|---|---|---|
| | Fig. 1 | Fig. 2 |
| Transistor 13 | 2N2713 | 2N2713 |
| Transistor 15 | 2N2713 | 2N2713 |
| Resistor 17 | 1K | 2K |
| Resistor 19 | 1K | 2K |
| Resistor 21 | 8.2K | 8.2K |
| Resistor 23 | 39K | 39K |
| Resistor 25 | 8.2K | 8.2K |
| Resistor 27 | 39K | 39K |
| Diode 29 | 1N4009 | 1N4009 |
| Resistor 31 | 100 | 100 |
| Diode 33 | 1N4009 | 1N4009 |
| Unijunction Transistor 35 | 2N1671A | 2N1671A |
| Variable Resistor 37 | 0 to 75K | 0 to 15K |
| Capacitor 39 | 15 | .01 |
| Resistor 41 | 62 | 100 |
| Resistor 43 | 180 | 220 |
| Diode 45 | 1N34A | ---------- |
| Diode 47 | 1N4009 | ---------- |
| Resistor 49 | 2.4K | ---------- |
| +V1 | +12 | +12 |
| −V2 | −12 | −12 |
| Transistor 51 | ---------- | 2N2713 |
| Resistor 53 | ---------- | 50 |

All values of resistance are given in ohms.
All values of capacitance are given in microfarads.
All values of voltage are given in volts.

The above description of my invention is by way of illustration only and it would be obvious to one skilled in the art that other embodiments would also be possible. For instance, other electronic threshold devices, such as thyratrons, could be used in place of unijunction transistor 35 with minor changes in circuitry. It is therefore my intention to be limited only by the scope of the following claims.

I claim:

1. A delay circuit comprising
a bistable circuit,
input triggering means for switching said bistable circuit from its first to its second state,
a unijunction transistor having a control electrode and an output electrode, series-connected RC timing means independent of said bistable circuit and attached to the control electrode of said unijunction transistor,
diode means coupling said timing means to said bistable circuit for clamping the voltage of said timing means below the firing voltage of said unijunction transistor while said bistable circuit is in its first state and for releasing said timing means to charge and fire said unijunction transistor for producing a pulse at said output terminal a predetermined time thereafter when said bistable circuit is switched to its second state, biasing means for resetting said bistable circuit to its first state, and diode clamping means coupling the output of said unijunction transistor to said biasing means for preventing said biasing means from operating until said unijunction transistor fires.

2. A delay resetting circuit for a bistable circuit which has a terminal whose potential is relatively low while said bistable circuit is in its first state and relatively high while said bistable is in its second state, comprising a unijunction transistor, adjustable RC timing means, independent of said bistable circuit, and attached to said unijunction transistor, diode means coupling said timing means to said terminal of said bistable circuit for clamping said timing means below the firing voltage of said unijunction transistor while said bistable circuit is in its first state and for releasing said timing means when said bistable circuit is switched to its second state for firing said unijunction transistor to produce a pulse at the output of said unijunction transistor a predetermined time after said bistable circuit is switched, biasing means attached to said bistable circuit for resetting it to its first state, and diode clamping means coupling the output of said unijunction transistor to said biasing means for preventing said biasing means from operating until said unijunction transistor fires.

References Cited

UNITED STATES PATENTS

| | | | |
|---|---|---|---|
| 2,636,984 | 4/1953 | Canfora | 308—206 |
| 2,986,652 | 5/1961 | Eachus | 307—88.5 |
| 2,997,665 | 8/1961 | Sylvan | 307—88.5 |
| 3,049,625 | 8/1962 | Brockman | 307—88.5 |
| 3,225,221 | 12/1965 | Scott | 307—88.5 |
| 3,299,288 | 1/1967 | McDowell et al. | 307—88.5 |

ARTHUR GAUSS, *Primary Examiner.*

B. P. DAVIS, *Assistant Examiner.*